United States Patent
Watanabe et al.

(10) Patent No.: US 7,495,264 B2
(45) Date of Patent: Feb. 24, 2009

(54) SEMICONDUCTOR DEVICE WITH HIGH DIELECTRIC CONSTANT INSULATING FILM AND MANUFACTURING METHOD FOR THE SAME

(75) Inventors: Heiji Watanabe, Tokyo (JP); Haruhiko Ono, Tokyo (JP); Nobuyuki Ikarashi, Tokyo (JP)

(73) Assignee: NEC Corporation, Tokyo (JP)

( * ) Notice: Subject to any disclaimer, the term of this patent is extended or adjusted under 35 U.S.C. 154(b) by 38 days.

(21) Appl. No.: 11/608,078

(22) Filed: Dec. 7, 2006

(65) Prior Publication Data

US 2007/0090450 A1   Apr. 26, 2007

Related U.S. Application Data

(62) Division of application No. 10/477,109, filed on Nov. 10, 2003, now Pat. No. 7,164,169.

(30) Foreign Application Priority Data

Aug. 23, 2001  (JP)  ............................. 2001/252258
Aug. 22, 2002  (WO)  ...................... PCT/JP02/08453

(51) Int. Cl.
   *H01L 21/00*   (2006.01)
   *H01L 21/331*  (2006.01)
   *H01L 21/22*   (2006.01)

(52) U.S. Cl. .................. 257/101; 257/185; 257/191; 257/285; 257/325; 257/463; 257/548; 257/558; 257/591; 257/592; 257/655; 438/37; 438/81; 438/350; 438/376; 438/547

(58) Field of Classification Search ........................ None
See application file for complete search history.

(56) References Cited

U.S. PATENT DOCUMENTS

| | | | | |
|---|---|---|---|---|
| 3,945,031 A * | 3/1976 | Kahng et al. | ................ | 257/325 |
| 5,608,250 A * | 3/1997 | Kalnitsky | ................... | 257/314 |
| 6,190,779 B1 | 2/2001 | Heimann et al. | | |
| 6,291,867 B1 | 9/2001 | Wallace et al. | | |
| 6,328,816 B1 | 12/2001 | Carlson et al. | | |
| 6,350,684 B1 | 2/2002 | Wang et al. | | |
| 6,642,131 B2 * | 11/2003 | Harada | ....................... | 438/591 |
| 6,809,371 B2 | 10/2004 | Sugiyama | | |
| 6,831,315 B2 | 12/2004 | Raaijmakers et al. | | |
| 6,841,439 B1 * | 1/2005 | Anthony et al. | ............. | 438/216 |
| 6,849,908 B2 * | 2/2005 | Hirano et al. | ............... | 257/410 |
| 2001/0023120 A1 | 9/2001 | Tsunashima et al. | | |
| 2002/0175393 A1 | 11/2002 | Baum et al. | | |
| 2003/0218223 A1 * | 11/2003 | Nishiyama et al. | .......... | 257/410 |

(Continued)

FOREIGN PATENT DOCUMENTS

JP         10-294432         11/1998

(Continued)

*Primary Examiner*—Zandra Smith
*Assistant Examiner*—James M Mitchell
(74) *Attorney, Agent, or Firm*—Sughrue Mion, PLLC

(57) ABSTRACT

A semiconductor device has a substrate and a dielectric film formed directly or indirectly on the substrate. The dielectric film contains a metal silicate film, and a silicon concentration in the metal silicate film is lower in a center portion in the film thickness direction than in an upper portion and in a lower portion.

11 Claims, 7 Drawing Sheets

U.S. PATENT DOCUMENTS

| | | |
|---|---|---|
| 2004/0070037 A1 * | 4/2004 | Takayanagi ................. 257/410 |
| 2005/0233156 A1 * | 10/2005 | Senzaki et al. .............. 428/446 |
| 2007/0166923 A1 * | 7/2007 | Shih et al. .................. 438/264 |

FOREIGN PATENT DOCUMENTS

| | | |
|---|---|---|
| JP | 11-135774 | 5/1999 |
| JP | 11-186523 | 7/1999 |
| JP | 2000-323591 | 11/2000 |
| JP | 2001-217238 | 8/2001 |
| JP | 5-275646 | 10/2006 |

* cited by examiner

SEMICONDUCTOR DEVICE WITH HIGH DIELECTRIC CONSTANT INSULATING FILM AND MANUFACTURING METHOD FOR THE SAME

This is a Divisional of application Ser. No. 10/477,109, filed Nov. 10, 2003. The entire disclosure of the prior application, application Ser. No. 10/477,109 is hereby incorporated by reference.

TECHNICAL FIELD

The present invention is relates to a semiconductor device and a manufacturing method for the same, and more particularly to the structure of a semiconductor device with a high dielectric constant insulating film such as a high-performance MOSFET (Metal-Oxide-Semiconductor Field-Effect Transistor) and a manufacturing method for the same.

BACKGROUND ART

A silicon oxide film has stability on processes and excellent insulation characteristic and is used as a gate insulating or dielectric film of a MOSFET. The thinner structure of the gate dielectric film is progressing with the miniaturization of a semiconductor device in recent years. It becomes necessary from the viewpoint of the scaling law in the semiconductor device that the gate length is equal to silicon oxide film as the gate dielectric film is equal to or less than 1.5 nm. However, in such a thinner dielectric film, tunnel current flowing through the insulating film in application of a gate bias can not be ignored to source/drain current. As a result, it becomes a big problem in superior performance and low power consumption in the MOSFET.

For this reason, the studies and developments are carried forward to decrease an effective thickness of the gate dielectric film and to suppress the tunnel current into a permissible value in system design. In one method, by adding nitrogen into the silicon oxide film, the dielectric constant is increased compared with a pure silicon oxide film. In this way, the film thickness of the gate dielectric film is decreased effectively (electrically) without decreasing the film thickness physically. However, there is a limit in this method in that the high dielectric constant is achieved by adding the nitrogen to the silicon oxide film. Also it is reported that the carrier mobility decreases due to electrical defects at the interface.

Moreover, for technique in the next generation that the miniaturization of the device further progresses, it is tried to use a thin film of metal oxides having a relative dielectric constant equal to or more than 10 or a silicate thin film of composite material of the above material and silicon as the gate dielectric film in place of the silicon oxide film. As such high relative dielectric constant material, $Al_2O_3$, $ZrO_2$, and $HfO_2$ oxide of the rare earth element such as $Y_2O_3$, and oxide of the lanthanoid system rare earth element such as $La_2O_3$ are studied as candidacy materials. This is on the basis of that the thicker gate dielectric film can be achieved to prevent the tunnel current while keeping the inversion capacitance in accordance with the scaling law, even though the gate length is made small, if these high relative dielectric constant films are used. It should be noted that when it is supposed that the gate dielectric film is a silicon oxide film regardless of the kind of material of the gate insulator, the film thickness of the insulating film calculated from the gate capacitance is called an equivalent oxide thickness (EOT). That is, when the relative dielectric constants of the dielectric film and the silicon oxide film are $\in h$ and $\in o$ respectively, and the thickness of the dielectric film is dh, the equivalent oxide thickness de is obtained from the following equation.

$$de = dh(\in o / \in h)$$

It shows that a thick insulating film can be equivalent to a thin silicon oxide film if the material has a dielectric constant $\in h$ large compared with $\in o$. For example, it is supposed that an insulating film with a large relative dielectric constant of $\in h=39$ is used because the relative dielectric constant $\in o$ of the silicon oxide film is about 3.9. In this case, even if the dielectric film has the physical thickness of 15 nm, the equivalent oxide thickness is 1.5 nm so that it is possible to decrease the tunnel current sharply.

On the other hand, in case of development of the semiconductor memory, severe conditions are imposed on the structure of a capacitance element to hold data as electric charge from the viewpoint of the reduction of the memory cell area. The technique to hold a sufficient amount of electric charge is required to a smaller cell area. In order to meet these requests, a technique is developed to increase the dielectric constant of the dielectric film of the capacitance element in addition to a technique to increase an element area by forming a minute unevenness structure to the capacitance element.

As described above, in the development of the next generation MOSFET, it is considered to adopt high dielectric constant material as the gate insulator, and the above-mentioned metal oxide film and the silicate film are expected as the high dielectric constant film. As characteristics of these two candidate material films, the metal oxide film generally has a high dielectric constant and can reduce the equivalent oxide thickness dramatically.

However, these high dielectric constant films crystallize (take the polycrystalline state) in a relatively low temperature region. Therefore, it is pointed out that the boundaries among the crystals (the crystal grain boundaries) are generated to cause the degradation of the insulation characteristic in these grain boundaries and the non-uniformity of the film thickness through crystallization. For this reason, a technical problem on application is in the securing of thermal stability as the gate dielectric film.

On the other hand, the dielectric constant of silicate material as ternary system material of metal oxide and silicon is lower than the metal oxide material but higher than the silicon oxide film. Also, the above-mentioned metal oxide material is easy to crystallize, whereas silicate material keeps an amorphous state in a high temperature range, and is not accompanied by the thermal change of the structure (characteristic). Therefore, the silicate material has predominance like the conventional silicon oxide film. Moreover, a film composition can be set in a wide range. It is reported that the dielectric constant increases by adding the metal element of % order to the silicon oxide film.

Also, in the application to the device for the high dielectric constant film, the electrical interface characteristics with the silicon substrate and the gate electrode material are important. Generally, the electrical interface characteristics between the metal oxide film and the silicon substrate are poor compared with those of the silicon oxide film and the silicon substrate and an interface defect density between the metal oxide and the silicon substrate is equal to or more than that of the silicon oxide film and the silicon substrate by one order. As the means of improving the electrical interface characteristics, the effectiveness of the metal silicate is pointed out.

In this way, attention is focused on the metal silicate material as the influential candidate material of the high dielectric constant gate dielectric film in the following generation. However, in application to the MOSFET, the following problems exist.

First, the electrical interface characteristics between the silicon substrate and the gate electrode material needs to be more improved. For this purpose, it could be considered that a silicon composition in the metal silicate is increased to approximate to the interface structure of the silicon oxide film. On the other hand, it is known that the crystallization temperature of the metal silicate decreases as the metal composition becomes high. Therefore, in order to achieve an excellent thermal stability, it is necessary to increase the silicon composition. However, the dielectric constant decreases with the increase of the silicon composition in the silicate. Thus, the high dielectric constant of a gate dielectric film and the thermal stability have a trade-off relation each other. That is, the metal silicate material has various excellent characteristics but is in the trade-off relation with setting of the film composition, as described above. Therefore, the proposal of an optimal metal silicate material or the gate dielectric film structure in case of device application is demanded.

In addition to the above-mentioned pointing-out, another problem of the high dielectric constant gate insulating film is a band gap of insulator material. Generally, there is a negative correlation between the dielectric constant and the band gap of the high dielectric constant material, and the high dielectric constant material has a narrow band gap. Therefore, when the valence band offset and the conduction band offset are small at the interface with the silicon substrate, carriers are thermally excited on the side of the silicon substrate or a gate electrode and more electric current flows through the gate dielectric film.

The above technical problems of the gate dielectric film in the case of the application to MOSFET are essentially same with respect to the dielectric film of a capacitor cell, although the device generation is different. The proposal of an insulating film structure with a high dielectric constant and thermal stability are demanded and excellent electrical interface characteristics are also demanded.

In conjunction with the above description, a high dielectric constant film and a manufacturing method for the same are disclosed in Japanese Laid Open Patent Application (JP-A-Heisei 5-275646). In this reference, the high dielectric constant film consists of the oxide of Ta and Hf as high dielectric constant materials and has a composition in the range that the mole ratio of elements is shown in the following equation.

$$0.01 \leq Hf/(Ta+Hf) \leq 0.4$$

A substrate is located in a vacuum chamber, source gases are introduced into the vacuum chamber, and energy is applied from outside to excite the source gases. Thus, the high dielectric constant film is vapor-deposited on the substrate. Ta source gas, Hf source gas, and oxygen containing gas are used, and a composition is controlled such that the mole ratios of elements of the high dielectric constant film are in the following range.

$$0.01 \leq Hf/(Ta+Hf) \leq 0.4$$

Also, a ferroelectric capacitor is disclosed in Japanese Laid Open Patent Application (JP-A-Heisei 10-294432). In this conventional example, the ferroelectric capacitor has the structure in which a ferroelectric film is put between a semiconductor substrate and an electrode. A reaction and/or diffusion barrier film are provided between the semiconductor substrate and the ferroelectric film or between the ferroelectric film and the electrode. The barrier film is formed of fluoride of at least one alkaline earth metal element selected from the group consisting of calcium, strontium and barium.

Also, a high dielectric constant silicate gate dielectric is disclosed in Japanese Laid Open Patent Application (JP-A-Heisei 11-135774). In this conventional example, a method of manufacturing an electric field effect device on an integrated circuit includes a step of providing a single crystal silicon substrate, a step of forming a metal silicate dielectric layer on the substrate and a step of forming a conductive gate on the metal silicate dielectric layer. When the metal silicate dielectric layer is formed, the substrate is cleaned such that pure Si is exposed on the substrate and a first metal film is deposited on the Si surface. The silicide film of first metal is formed on the substrate by annealing the substrate in an inactive environment, and a metal silicide dielectric layer is formed by oxidizing the silicide layer of the first metal. Or, when the metal silicate dielectric layer is formed, first metal and silicon are deposited on the substrate in an oxidant environment to form a layer oxidized partially at least, and then an annealing is carried out in the oxidant environment. Or, when the metal silicate dielectric layer is formed, the substrate is cleaned such that the pure Si is exposed on the substrate and a metal silicate having oxygen vacancies is deposited on the Si surface, and then an annealing is carried out to the metal silicate in the oxygen environment to form a high-quality metal silicate dielectric layer.

Also, in this conventional example, a field effect device is composed of a single crystal silicon semiconductor channel region, and a metal silicate gate dielectric layer formed on the channel area. The metal silicate is selected from the group consisting of zirconium silicate, barium silicate, cerium silicate, zinc silicate, thorium silicate, bismuth silicate, hafnium silicate, tantalum silicate and those combinations. A conductive gate is provided to cover the gate dielectric layer.

Also, insulator material is disclosed in Japanese Laid Open Patent Application (JP-A-Heisei 11-186523). In this reference, the insulator has crystal material which contains Ti and in which an atomic concentration ratio Bi/Ti in $Bi_2SiO_5$ is equal to or more than 3. The insulator film is formed by heating and vaporizing raw materials which consist of a metal compound containing Bi and a metal compound containing Ti, and by supplying these vaporized gases onto a Si substrate which is kept to a predetermined temperature, at the same time under predetermined pressures with an inactive carrier gas and an oxygen gas.

Also, a method of forming a semiconductor device and a dielectric film is disclosed in Japanese Laid Open Patent Application (JP-P 2000-323591). In this conventional example, a single crystal silicon layer is epitaxially grown on a silicon substrate. Bi, Si and oxygen are diffused to form a bismuth silicate film by introducing an oxygen gas and a gas obtained by vaporizing alt-tri-bismuth into a reaction chamber, and by keeping the substrate at a high temperature. Moreover, a BIT film as a ferroelectric substance film is formed on the bismuth silicate film. After that, after a polysilicon film is deposited on the substrate, the polysilicon film, the BIT film and the bismuth silicate film are patterned in order. Thus, a gate electrode, a storage section and a buffer layer are formed. Deterioration of the characteristic of MFISFET caused by the erosion of a channel region can be prevented and the structure near the boundary between the buffer layer and the storage section becomes good.

DISCLOSURE OF INVENTION

Therefore, an object of the present invention is to provide a high dielectric constant insulating film to improve electrical characteristics and thermal stability of the dielectric film and the manufacturing method of the same.

Also, another object of the present invention is to provide a semiconductor device having a metal silicate film as a high dielectric constant insulating film and a manufacturing method for the same.

In an aspect of the present invention, a semiconductor device includes a metal silicate film as a dielectric film. The metal silicate film has a lower portion, a center portion and an upper portion, and a silicon concentration in the metal silicate film is higher in the upper portion than the center portion.

Also, in another aspect of the present invention, a semiconductor device includes a metal silicate film as a dielectric film. The metal silicate film has a lower portion, a center portion and an upper portion, and a silicon concentration in the metal silicate film is lower in the upper portion and the lower portion than the center portion.

Also, in another aspect of the present invention, a semiconductor device includes a substrate, and a dielectric film directly or indirectly on the substrate. The dielectric film contains a metal silicate film, and the metal silicate film has a lower portion, a center portion and an upper portion, and a silicon concentration in the metal silicate film is lower in the center portion than in the upper portion and in the lower portion.

Here, the substrate is a silicon substrate, and the metal silicate film may be formed directly on the substrate.

Also, the metal silicate film may be formed on the substrate through at least one in a polysilicon film, a polycide film and a silicide film.

At this time, it is desirable that the semiconductor device may further include a doped layer formed on the substrate, and the dielectric film functions as a gate oxide film.

Also, the dielectric film may be formed on the substrate through the interlayer dielectric film, and the dielectric film may be a capacitive insulating film for a capacitor.

In this case, the semiconductor device may further include a conductive film formed on a surface on the dielectric film. Also, the metal silicate film may contact the conductive film. Also, a portion of the conductive film contacting the metal silicate film is desirably formed of one of a polysilicon germanium, a polysilicon, a polycide and silicide.

Also, a silicon concentration in the metal silicate film may change continuously or in a step manner.

The metal silicate film desirably contains one or more elements of the group consisting of Zr, Hf, Ti, Ta, Al, Nb, Sc, Y, La, Ce, Pr, Nd, Sm, Eu, Gd, Tb, Dy, Ho, Er, Tm, Yb, and Lu.

In another aspect of the present invention, a method of manufacturing a semiconductor device, is achieved by (a) starting formation of a metal silicate film on a semiconductor substrate by supplying a first source gas which contains silicon in a first flow rate, and supplying a second source gas which contains at least one metal element in a second flow rate; and by (b) continuing the formation of the metal silicate film on the semiconductor substrate by changing the flow rate of the first source gas from the first flow rate into a third flow rate, and by changing the flow rate of the second source gas from the second flow rate into a fourth flow rate. A ratio of the first flow rate to the second flow rate is larger than the third flow rate and the fourth flow rate ratio.

The method of manufacturing the semiconductor device may further include (c) completing the formation of the metal silicate film on the semiconductor substrate by changing the flow rate of the first source gas from the third flow rate into a fifth flow rate, and by changing the flow rate of the second source gas from the fourth flow rate into a sixth flow rate. A ratio of the third flow rate and the fourth flow rate is smaller than the fifth flow rate and the sixth flow rate ratio.

Further, it is desirable to carry out a thermal treatment to the metal silicate film after the (c).

Preferably, the first source gas is continuously changed from the first flow rate into the third flow rate and the second source gas is continuously changed from the second flow rate into the fourth flow rate. Instead, the first material gas may be changed from the first flow rate into the third flow rate in a step manner and the second material gas may be changed from the second flow rate into the fourth flow rate in a step manner.

Preferably, the second source gas contains one or more element selected from the group consisting of Zr, Hf, Ti, Ta, Al, Nb, Sc, Y, La, Ce, Pr, Nd, Sm, Eu, Gd, Tb, Dy, Ho, Er, Tm, Yb, and Lu.

In another aspect of the present invention, a semiconductor device includes a semiconductor substrate; a metal silicate film formed on the semiconductor substrate as a gate dielectric film; and a gate electrode formed on the metal silicate film. A dielectric constant of the metal silicate film changes in a thickness direction of the metal silicate film, and is the largest on a center portion thereof.

At this time, the metal silicate film has a band gap larger than that of silicon, and the metal silicate film may include a lower portion layer, a center layer, and an upper portion layer. It is preferable that the band gap in each of the lower portion layer and the upper portion layer is larger than that of the center layer and the dielectric constant in the center layer is larger than that of the lower portion layer and the upper portion layer.

The dielectric constant may change continuously or in a step manner.

Also, in another aspect of the present invention, a semiconductor device includes an dielectric film formed on a semiconductor substrate; a lower electrode formed on the insulating film; a metal silicate film formed on the lower electrode; and an upper electrode formed on the metal silicate film. A dielectric constant of the metal silicate film changes into a thickness direction of the metal silicate film and is the largest in a center portion.

The dielectric constant may change continuously or in a step manner.

BEST MODE FOR CARRYING OUT THE INVENTION

Hereinafter, a semiconductor device having a high dielectric constant insulating film of the present invention will be described with reference to the attached drawings.

Figure 1:
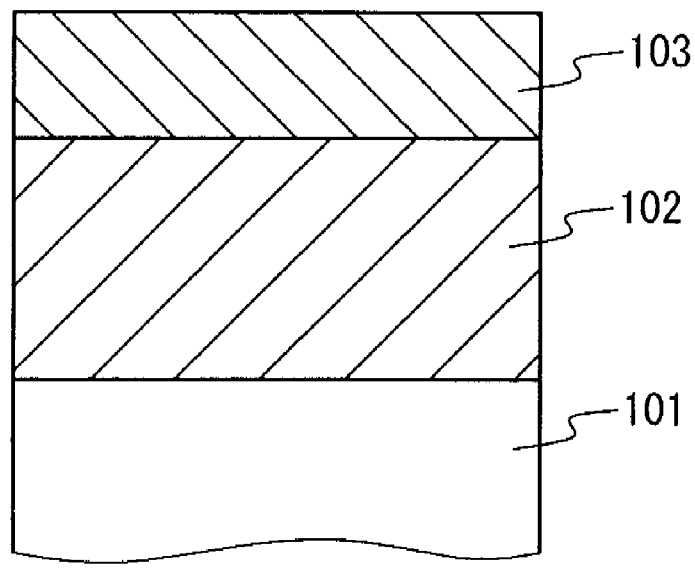
FIG. 1 is a cross sectional view showing the structure of a semiconductor device of the present invention.

FIG. 1 is a cross sectional view showing the structure of the semiconductor device having the high dielectric constant insulating film of the present invention. A dielectric film 102 is formed on a silicon substrate 101, and a polysilicon electrode 103 is formed on the dielectric film 102. A polysilicon germanium electrode may be used in place of the polysilicon electrode 103. The dielectric film 102 contains a metal silicate film. That is, the dielectric film 102 may be a metal silicate film as a whole or may have other insulating films in an upper or lower portion. In the following description, the dielectric film 102 consists of the metal silicate film.

Figure 2:
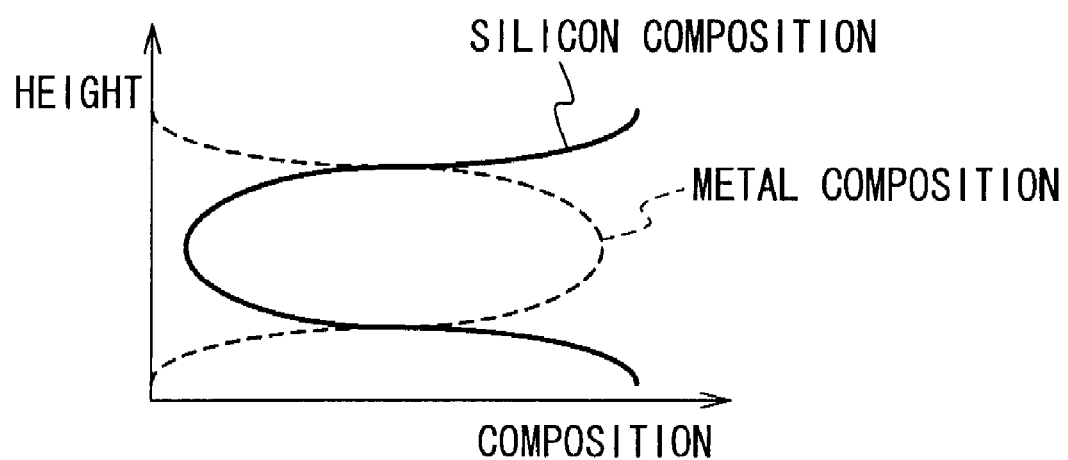
FIG. 2 is a diagram showing a composition profile of a dielectric film in the structure shown in FIG. 1.

FIG. 2 is a diagram showing the composition of metal and silicon in the metal silicate film 102. As shown in FIG. 2, in the metal silicate film 102 of the present invention, the metal composition has a maximum in a center portion and becomes the minimum in the lower or upper portion of the film. The silicon composition is in the complementary relation to the metal composition, and has the minimum in the center portion and the maximum in the lower and upper portions of the film. As one example of this composition modulated structure, a laminate structure of metal oxide films and a metal silicate film having the silicon composition modulation is contained such that the silicon composition is zero in the center portion. Also, as another example, a laminate structure is also contained of a metal silicate film and oxide films such that the metal composition becomes zero in upper and/or lower portions of the metal silicate film.

Figure 3:
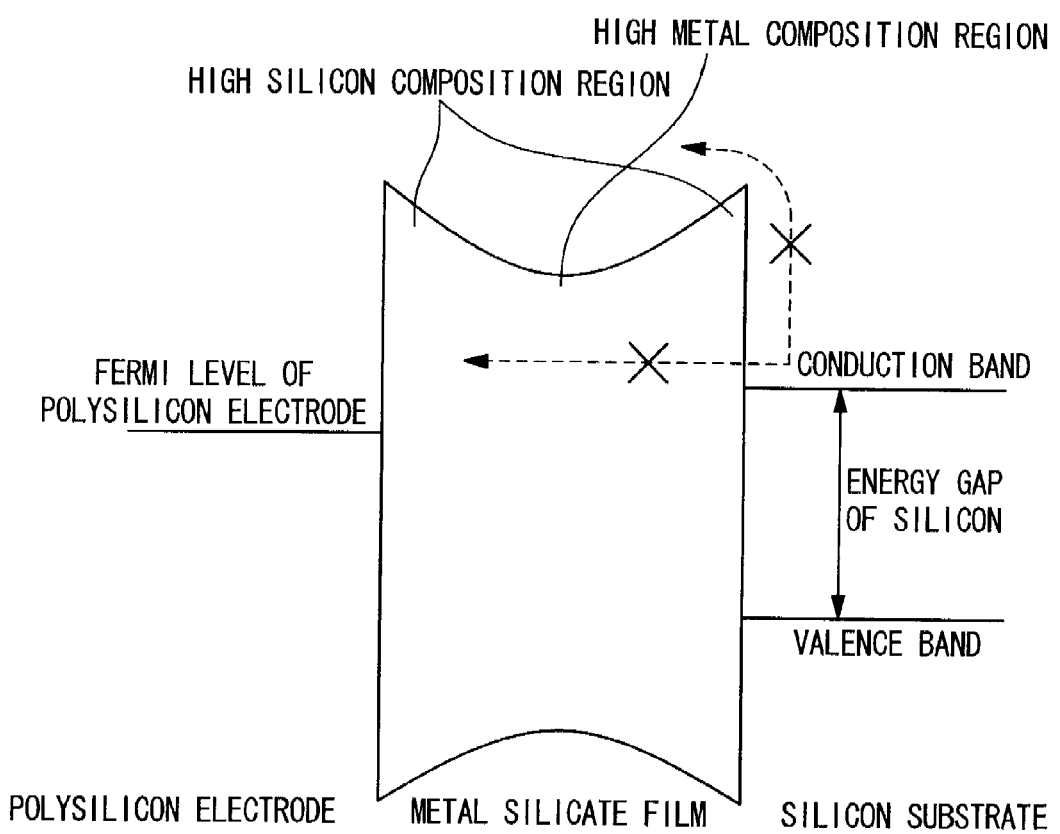
FIG. 3 is a diagram showing an energy band of a MOS structure that has a silicate dielectric film whose composition is modulated into a direction of a film thickness.

When the metal silicate film of the present invention is used as a gate dielectric film, the dielectric constant can be made high in the film center portion of the structure shown in FIG. 2, because the dielectric constant of the metal silicate becomes high with the increase of metal concentration. Also, the silicon concentration may increase continuously or in a step manner toward the upper and lower boundaries such that the composition of the gate dielectric film becomes equivalent to that of the silicon oxide film at the interface with a silicon substrate, a polysilicon gate electrode or a polysilicon germanium gate electrode. Therefore, the electrical interface characteristics become similar to those of the silicon oxide film and the silicon, and it is possible to realize the junction excellent in the electrical interface characteristics compared with the conventional metal oxide film/silicon interface, or the metal silicate/silicon interface. Moreover, because the silicon oxide film has a wide band gap compared with usual high dielectric constant material, as shown in FIG. 3, the band gap extends at the interface or the neighborhood where the silicon composition is high. Therefore, band offset at the interfaces become large, and it is possible to restrain an electric current component which flows through the gate dielectric film even when carriers are excited thermally in the silicon substrate and the gate electrode.

In addition, according to the silicate dielectric film of the present invention, the improvement of the thermal stability of the gate dielectric film is achieved. The crystallization temperature of the silicate in which the metal composition is high is low relatively. However, as described above, the structure shown in FIG. 1 has a laminate structure in which the layer of a high metal composition is put between the high silicon composition layers and has a high crystallization temperature. Therefore, it is possible to raise the crystallization temperature of the film center portion having the high metal composition. As a result, in the MOS structures having a same gate insulator, the gate dielectric film having the composition modulation structure of the present invention can realize the more excellent thermal stability compared with a case of the uniform composition.

Figure 7A:
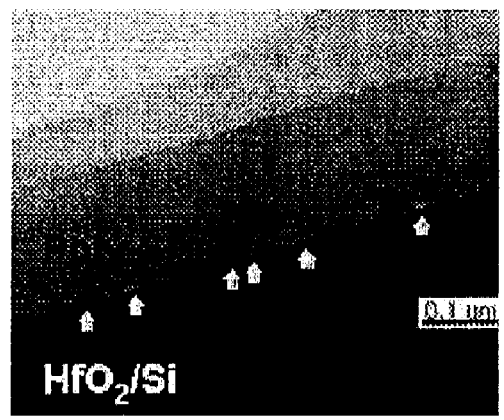
FIGS. 7A to 7C are photographs showing observation examples of voids at the poly-Si/Hf silicate interface.
Figure 7B:
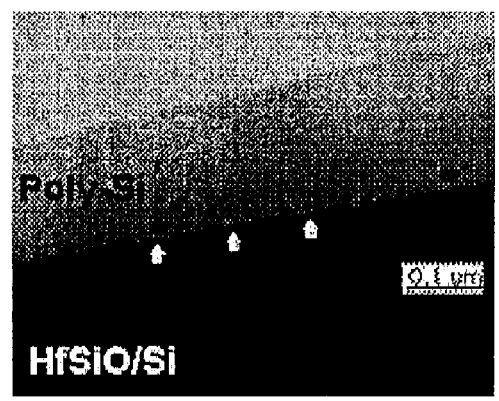
Figure 7C:
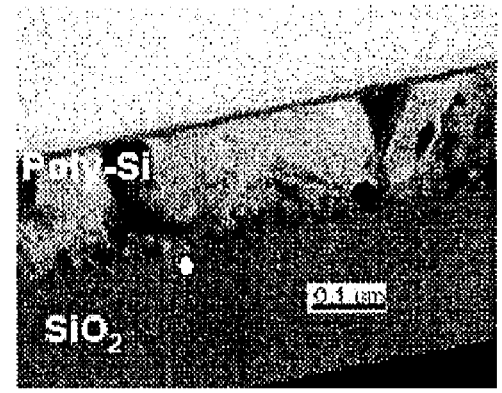

Moreover, in the silicate dielectric film of the present invention, the interface characteristics are improved between the polysilicon (poly-Si) electrode (or polysilicon germanium (poly-SiGe) electrode) and the gate dielectric film. Generally, poly-Si (or poly-SiGe) electrode is formed on the high dielectric constant film by an LPCVD method and so on, but voids are formed at the interface between the poly-Si (or poly-SiGe) electrode and the high dielectric constant film. FIGS. 7A to 7C show observation examples of such voids. FIGS. 7A and 7B are the sectional observation examples by the transmission electron microscope when the poly-Si film is deposited on the Hf silicate film by the LPCVD method. The composition in the surface of the Hf silicate film is Hf$_x$Si$_{1-x}$O$_2$ (x≈1.0:HfO$_2$), Hf$_x$Si$_{1-x}$O$_2$ (x≈0.3) in FIGS. 7A and 7B, respectively. As shown by the arrows at the interfaces of the samples, voids with about 30-nm diameter and about 10-nm height are observed. On the other hand, FIG. 7C is a cross sectional observation example when a poly-Si film is deposited on SiO$_2$. Any void is not observed at the interface of poly-Si/SiO$_2$ unlike the above examples. Such a void causes depletion at an electrode/high dielectric film. As a result, the electrical thickness of the gate dielectric increases and a merit by using a high dielectric constant film as the gate dielectric film passes away.

Figure 8:
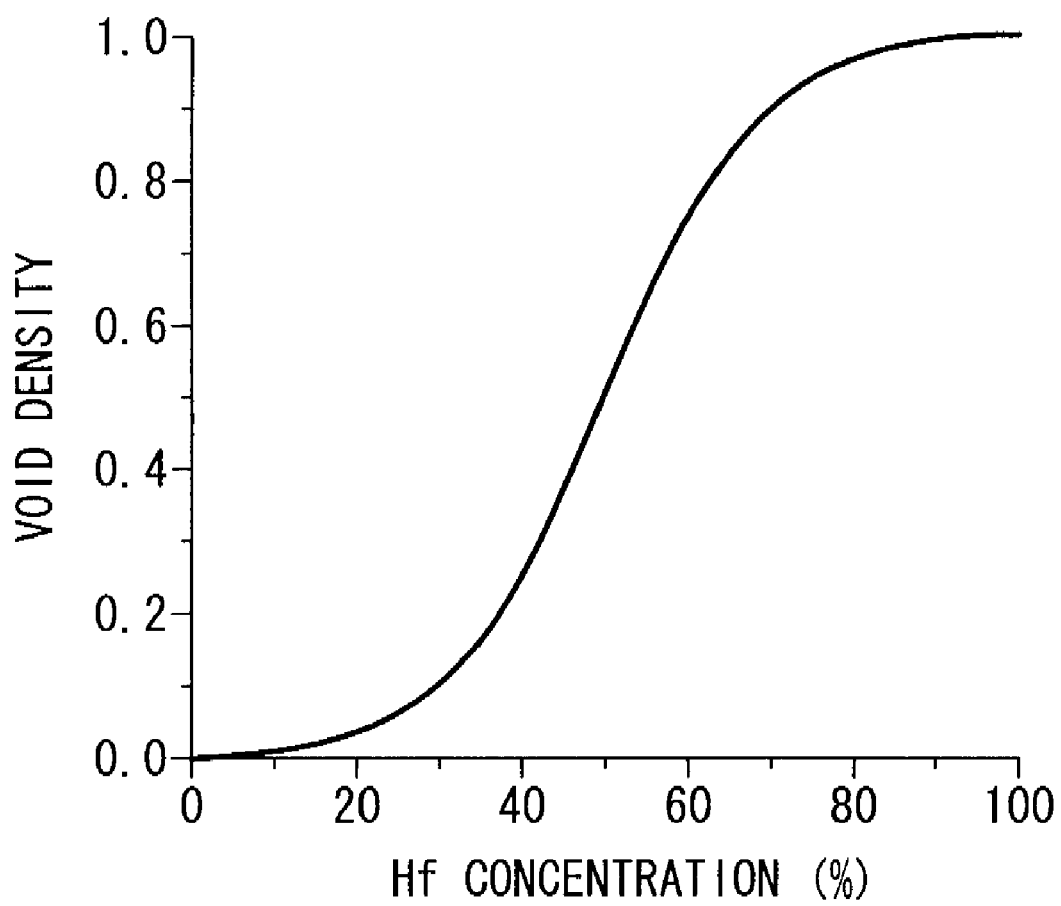
FIG. 8 is a graph showing a dependency of a void density on a silicate surface Hf concentration at the poly-Si/Hf$_x$Si$_{1-x}$O$_2$ interface.

It is possible to avoid the formation of the void by employing the structure of the present invention in which the Si concentration in the high dielectric constant film is made high at the interface between poly-Si and the high dielectric constant film. This is because a density of voids decreases as the Hf concentration in the high dielectric constant film decreases. FIG. 8 is a graph showing the density of voids to the surface Hf concentration of the silicate film. The horizontal axis shows Hf concentration in the % unit. The vertical axis shows the density of voids, supposing that a void density when the Hf concentration is 100% is 1. The void density decreases rapidly as Hf concentration decreases. As understood from the graph of FIG. 8, if the Hf composition in the silicate film is equal to or less than 0.5, the voids decrease rapidly and it is possible to avoid the device characteristic degradation due to the defects such as the voids and so on at the interface conspicuously. Also, it could be understood that the Hf composition is desirable to be equal to or less than 0.3 for restraining the influence to such a device characteristic as much as possible.

It should be noted that the case that the electrode is poly-Si is described in the above. However, the structural defects at the interface between the electrode and the high dielectric constant film can be restrained by the silicate dielectric film of the present invention even in case that a poly-SiGe electrode is deposited on the high dielectric constant film using a source gas containing a silane, like this poly-Si electrode.

Also, the case that poly-Si film is deposited on the Hf silicate film is described in the above. However, when the poly-SiGe film is deposited on the Zr silicate film, the voids are generated at the interface if a Zr concentration is high and the generation of the void is restrained if the Zr concentration is low at the interface. This shows that it is easy for the voids to generate when a metal concentration is high in the silicate film surface. Therefore, it could be considered that the same phenomenon occurs when the silicate contains metals such as Zr, Hf, Ti, Ta, Al, Nb, Sc, Y, La, Ce, Pr, Nd, Sm, Eu, Gd, Tb, Dy, Ho, Er, Tm, Yb, and Lu.

In this way, in the present invention, while eliminating various trade-off relations of the composition in the metal silicate film as a problem in case of application, the improvement of the thermal stability is realized at the same time as the improvement of the electrical interface characteristics and the increase of dielectric constant of the gate dielectric film. Thus, it is possible to provide the high dielectric constant gate insulating film that is desirable in case of device manufacture.

Also, from the same reason as the above, when the metal silicate film according to the present invention is used as the dielectric film of a capacitor that has a polysilicon film as an electrode, the high dielectric constant can be realized while improving interface characteristics, and the thermal stability can be improved.

Therefore, the semiconductor device according to the present invention has a structure in which the high dielectric constant film formed of metal oxide or metal silicate can be used as the gate dielectric film for the capacitor cell, and the silicon composition in the high dielectric constant film is modulated in the direction of the film thickness. The silicon composition in the gate dielectric film increases on the junction side of the high dielectric constant film with the silicon substrate or the polysilicon (the polysilicon germanium) electrode, and the silicon composition in the gate dielectric film increases on the junction side with the gate electrode or the polysilicon (the polysilicon germanium) upper electrode.

Next, as the manufacturing method of the semiconductor device according to the present invention, when a film is formed in a CVD (Chemical Vapor Deposition) method, a silicon source gas ratio is set high at an initial stage of the film formation, and a metal source gas ratio is set high in the film formation of the film center portion. After that, the silicon source gas ratio is again set high at a final stage of the film formation. It is desirable to carry out thermal treatment after the film has been formed, in order to improve the film quality. It is also desirable that the thermal treatment is carried out in the oxidizing or inactive atmosphere for 10 sec. to 10 min. at the temperature of 500 to 900° C. The film deposition method in which the gas supply ratio is changed is effective in case that the silicon and metal source gas ratios are changed in the formation of gas absorption layers in the Atomic Layer Deposition (ALD) method in which deposition in each layer is carried out every atom or molecule layer, in addition to a continuous CVD film formation.

It should be noted that it is desirable to carry out thermal treatment after film formation to improve the film quality. The desirable thermal treatment condition is in the temperature range of 500 to 900° C. for 10 sec. to 10 min. in the oxidizing or inactive atmosphere.

The desirable metal silicate used in the present invention is silicate of metal for high dielectric constant metal oxide, rare earth element silicate, and lanthanoid system element silicate, that is, ZrSiO, HfSiO, TiSiO, TaSiO, AlSiO, NbSiO, ScSiO, YSiO, LaSiO, CeSiO, PrSiO, NdSiO, SmSiO, BuSiO, GdSiO, TbSiO, DySiO, HoSiO, ErSiO, TmSiO, YbSiO, and LuSiO.

Next, more specifically, the semiconductor device according to the first embodiment of the present invention will be described with reference to the drawings.

Figure 4A:
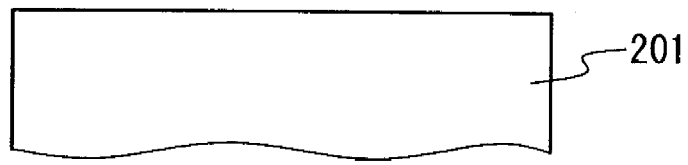
FIGS. 4A to 4c are cross sectional views showing a method of manufacturing a semiconductor device according to a first embodiment of the present invention.
Figure 4B:
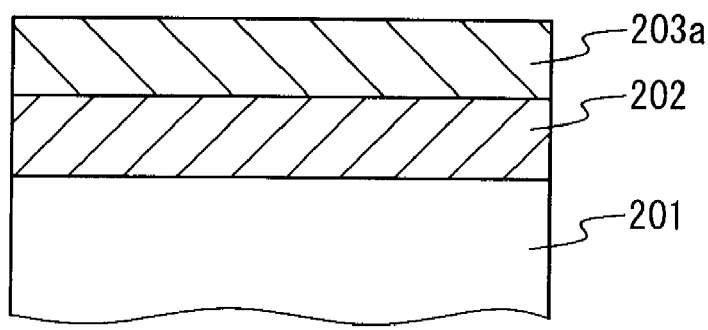
Figure 4C:
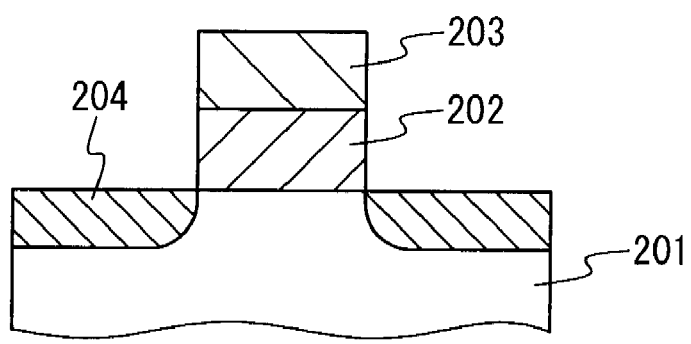

FIGS. 4A to 4C are cross sectional views showing the manufacturing method of the semiconductor device according to the first embodiment of the present invention. First, as shown in FIG. 4A, after the surface of a p-type silicon substrate 201 is washed or rinsed, a hydrofluoric acid process is carried out to remove an oxide film from the substrate surface.

Next, as shown in FIG. 4B, the p-type silicon substrate 201 is introduced into a reaction furnace, a zirconium silicate film 202 is formed as a gate dielectric film to have the film thickness of 4 nm by using $ZrCl_4$ and $SiCl_4$ as source gases, and $H_2O$ as oxidant. In this case, the flow rate of $SiCl_4$ is increased and the flow rate of $ZrCl_4$ is decreased to 0 in the initial stage and the final stage of the film formation. Also, in the middle stage of the film formation, the flow rate of $SiCl_4$ is minimized and the flow rate of $ZrCl_4$ is maximized. Between the initial stage and the middle stage and between the middle stage and the final stage in the film formation, both or one of the flow rate of $SiCl_4$ and the flow rate of $ZrCl_4$ are gradually changed, and a silicate film is formed to mainly have the composition of $SiO_2$ in the upper and lower film portions, and the composition of $Zr_{0.9}Si_{0.1}O_2$ in the film center portion, such that the composition continuously changes between them. After the film formation, the thermal treatment is carried out at the temperature of 550° C. in the oxygen atmosphere for one minute to improve the film quality. Subsequently, a polysilicon film 203a is formed on the zirconium silicate film 202 to have the film thickness of 600 nm by a reduced pressure CVD method.

Next, as shown in FIG. 4C, the polysilicon film 203a and the zirconium silicate film 202 are patterned to form a gate electrode 203. Arsenic ions are implanted by using the gate electrode 203 as a mask to form n-type doped regions 204 as a source and drain regions.

The capacitance-voltage and current-voltage characteristics in the MOSFET device manufactured in this way were evaluated. As a result, it was found that the equivalent oxide thickness was 1.5 nm, and that the leakage current flowing through the gate dielectric film was reduced by about 3 orders of magnitude compared with the silicon oxide film of the same electrical thickness.

Figure 5A:
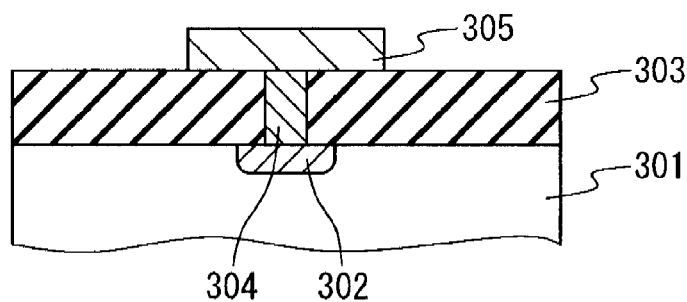
FIGS. 5A to 5C are cross sectional views showing a method of manufacturing a semiconductor device according to a second embodiment of the present invention.
Figure 5B:
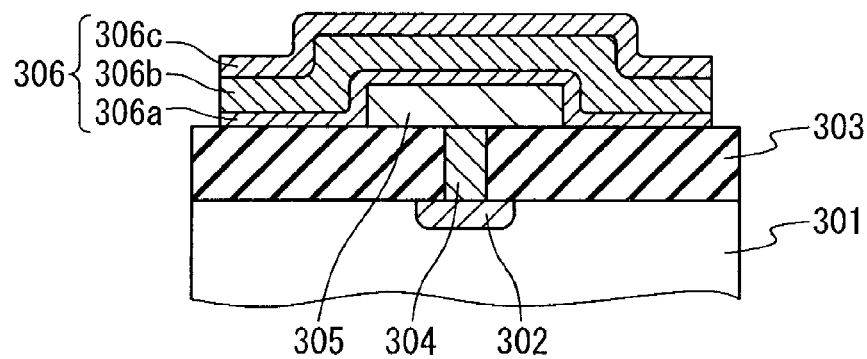
Figure 5C:
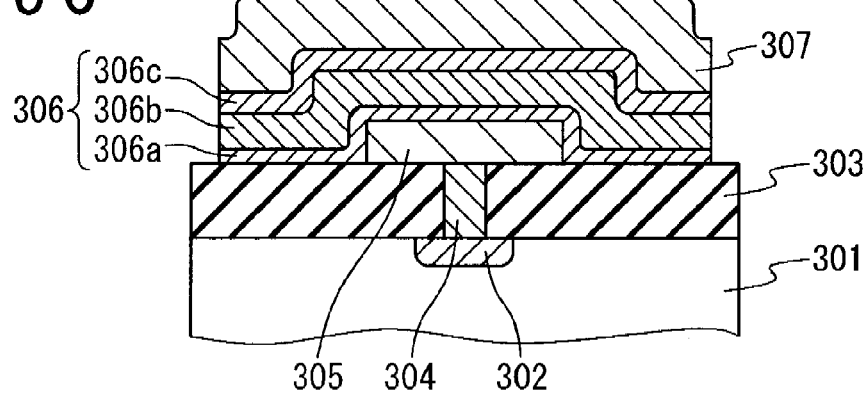
Figure 6:
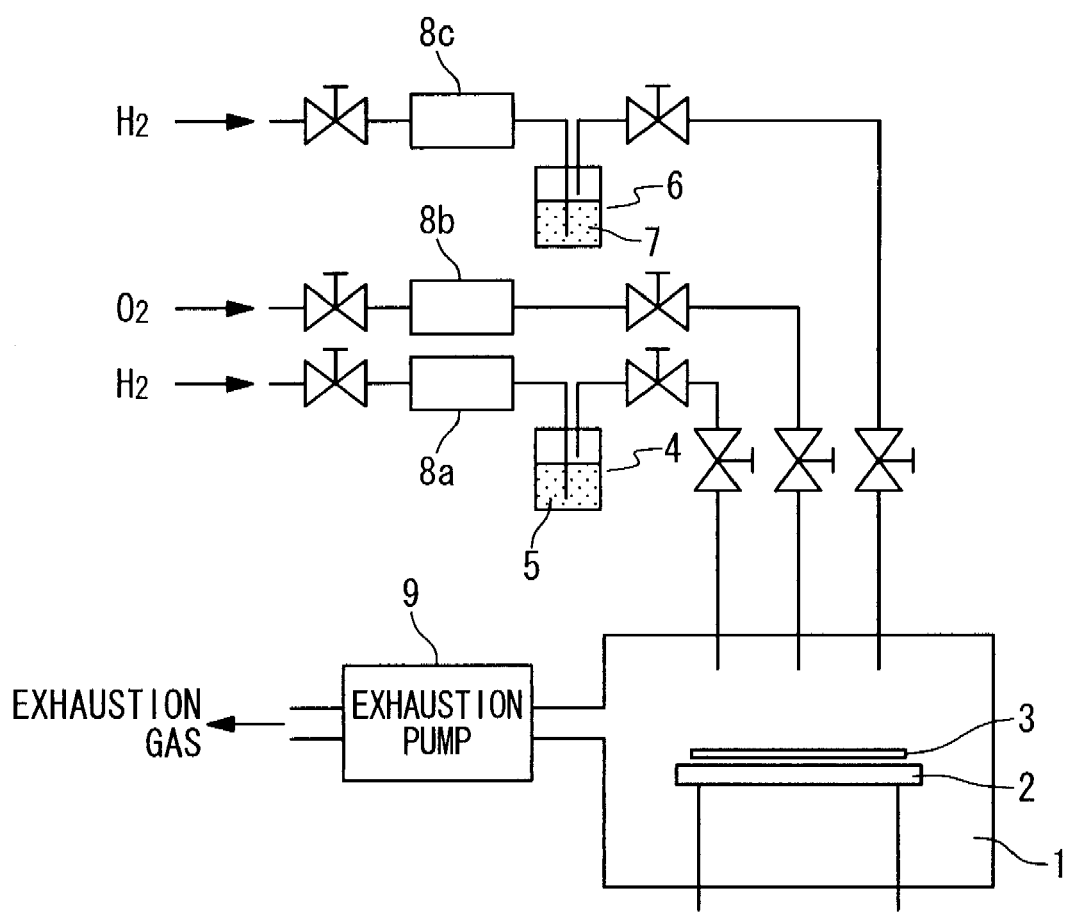
FIG. 6 is a cross sectional view showing the structure of a film forming apparatus used for manufacturing the semiconductor device according to the second embodiment of the present invention.

FIGS. 5A to 5C are cross sectional views showing the method of manufacturing the semiconductor device according to the second embodiment of the present invention. FIG. 6 is a cross sectional view of the film deposition apparatus (the MOCVD apparatus) used in the second embodiment. A tantalum silicate film that the composition changes into a step manner is formed for the semiconductor device of the second embodiment, using the film deposition apparatus shown in FIG. 6.

As shown in FIG. 6, a substrate 3 is located on a substrate stage 2 in a film deposition chamber 1. $Ta[N(C_2H_5)_2]_4$ 5 as organic metal source is accommodated in a babbler 4 and $Si[N(C_2H_5)_2]_4$ is accommodated in a babbler 6. $H_2$ gas is supplied into the babbler 4 through a mass flow controller 8a and $H_2$ gas is supplied into the babbler 6 through a mass flow controller 8c. $O_2$ gas is supplied to the film deposition chamber through a mass flow controller 8b. Gases in the film deposition chamber 1 are exhausted by an exhaust pump 9. According to a flow shown in FIGS. 5A to 5C, the manufacturing method will be described. First, an interlayer dielectric film 303 is formed on the p-type silicon substrate having an n-type region 302 in the surface region as shown in FIG. 5A. A contact hole is opened to pass the interlayer dielectric film 303 to the n-type area 302. Subsequently, tungsten is embedded in the contact hole to form a conductivity plug 304. A lower electrode 305 is formed through polysilicon deposition and polysilicon patterning to contact the conductivity plug 304.

Next, the substrate is located in film deposition chamber shown in FIG. 6. After that, a substrate temperature is increased to 400° C. and NO gas is supplied in the flow rate of 50 sccm through the mass flow controller 8b. H₂ gas is supplied in the flow rate of 1 sccm through the mass flow controller 8a, and at the same time, H₂ gas is supplied in the flow rate of 10 sccm through the mass flow controller 8c. Thus, a silicon rich layer 306a is formed to have the film thickness of 1 nm.

Next, the supply flow rate of NO gas through the mass flow controller 8b is kept to 50 sccm, the flow rate of H₂ gas through the mass flow controller 8a is set to 10 sccm and the flow rate of H₂ gas through the mass flow controller 8c is set to 1 sccm. In this way, a metal rich layer 306b is formed on the whole surface to have the film thickness of 2 nm. After that, a silicon rich layer 306c is formed to have the film thickness of 1 nm in the same condition as the lower silicon rich layer 306a is formed. In this way, the film formation of the tantalum silicate film 306 completes.

Next, as shown in FIG. 5C, to improve a film quality, a thermal treatment is carried out at the temperature of 550° C. in the nitrogen atmosphere for 5 minutes. Subsequently, the polysilicon film having the film thickness of 600 nm is formed on the tantalum silicate film 306 by a CVD method, and is patterned to form the upper electrode 307 of the capacitor.

In the capacitor cell formed in this way, an equivalent oxide thickness is 2.0 nm and the leakage current flowing through the dielectric film is reduced to about 2 orders of magnitude compared with the silicon oxide film.

As described above, the present invention is not limited to them. A person in the art will be able to modify the embodiments suitably in the range which does not deviate from the scope of the present invention. For example, the conductive layer formed on the metal silicate film does not have to be always the polysilicon film and the polycide film, and the silicide film and so on may be used. Also, when the silicon (metal) composition changes into the step manner, there may be a plurality of composition change points in each of the upper layer and the lower layer. Moreover, the fabrication method can use a method of forming other than the CVD method, e.g. a sputtering method and so on. When the sputtering method is used, the sputtering method using a multi-target (e.g., Zr target and SiO₂ target) is favorably adopted.

As described above, in the metal silicate film of the present invention, the metal composition is high in the film center portion and the silicon composition is increased in the lower portion and the upper portion of the film. Therefore, according to the present invention, it is possible to manufacture the semiconductor device having the silicate film of high dielectric constant superior to the silicon oxide film and having the electrical characteristics and the thermal stability excellent compared with the high dielectric constant film of a metal oxide. Also, the MOSFET and the highly efficient capacitance device with high efficiency and moreover low power consumption can be realized.

The invention claimed is:

1. A semiconductor device comprising:
   a substrate; and
   a dielectric film directly or indirectly on said substrate,
   wherein said dielectric film contains a metal silicate film, and said metal silicate film has a lower portion, a center portion and an upper portion, and
   a silicon concentration in said metal silicate film is higher in said center portion than in said upper portion and in said lower portion.

2. The semiconductor device according to claim 1, wherein said substrate is a silicon substrate, and
   said metal silicate film is formed directly on said substrate.

3. The semiconductor device according to claim 1, wherein said metal silicate film is formed on said substrate through at least one of a polysilicon film, a polycide film and a silicide film.

4. The semiconductor device according to claim 2 or 3, further comprising:
   a doped layer formed on said substrate,
   wherein said dielectric film functions as a gate oxide film.

5. The semiconductor device according to claim 1, wherein said dielectric film is formed on said substrate through an interlayer dielectric film, and
   said dielectric film is an insulating film for a capacitor.

6. The semiconductor device according to any of claims 1 to 5, further comprising:
   a conductive film formed on a surface on said dielectric film.

7. The semiconductor device according to claim 6, wherein said metal silicate film contacts said conductive film.

8. The semiconductor device according to claim 6 or 7, wherein a portion of said conductive film contacting said metal silicate film is formed of one of a polysilicon germanium, a polysilicon, a polycide and silicide.

9. The semiconductor device according to any of claims 1 to 8, wherein a silicon concentration in said metal silicate film changes continuously.

10. The semiconductor device according to any of claims 1 to 8, wherein a silicon concentration in said metal silicate film changes in a step manner.

11. The semiconductor device according to any of claims 1 to 10, wherein said metal silicate film contains one or more elements selected from the group consisting of Zr, Hf, Ti, Ta, Al, Nb, Sc, Y, La, Ce, Pr, Nd, Sm, Eu, Gd, Tb, Dy, Ho, Er, Tm, Yb, and Lu.

* * * * *